United States Patent
Aoki

(10) Patent No.: US 9,825,038 B2
(45) Date of Patent: Nov. 21, 2017

(54) SEMICONDUCTOR DEVICE

(71) Applicant: Semiconductor Energy Laboratory Co., Ltd., Atsugi-shi, Kanagawa-ken (JP)

(72) Inventor: Takeshi Aoki, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/467,142

(22) Filed: Mar. 23, 2017

(65) Prior Publication Data

US 2017/0194327 A1 Jul. 6, 2017

Related U.S. Application Data

(62) Division of application No. 14/471,151, filed on Aug. 28, 2014, now Pat. No. 9,607,991.

(30) Foreign Application Priority Data

Sep. 5, 2013 (JP) .................................. 2013-184202

(51) Int. Cl.
*H01L 27/108* (2006.01)
*H01L 27/105* (2006.01)
(Continued)

(52) U.S. Cl.
CPC ........ *H01L 27/1052* (2013.01); *H01L 27/124* (2013.01); *H01L 27/1225* (2013.01);
(Continued)

(58) Field of Classification Search
CPC .......... H01L 23/49827; H01L 29/7869; H01L 27/10805; H01L 27/1085; H01L 27/10873;
(Continued)

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Jessica Manno
*Assistant Examiner* — Mohammed R Alam
(74) *Attorney, Agent, or Firm* — Fish & Richardson P.C.

(57) ABSTRACT

To provide a semiconductor memory device which can be manufactured with high yield and which can achieve higher integration. A pair of memory cells adjacent to each other in the bit line direction is connected to a bit line through a common contact hole. The pair of memory cells adjacent to each other in the bit line direction shares an electrode connected to the bit line. An oxide semiconductor layer included in the memory cell is provided to overlap with a word line and a capacitor line. A transistor and a capacitor included in the memory cell are each provided to overlap with the bit line connected to the memory cell.

10 Claims, 8 Drawing Sheets

(51) Int. Cl.
*H01L 27/12* (2006.01)
*H01L 29/786* (2006.01)
*H01L 29/24* (2006.01)

(52) U.S. Cl.
CPC .......... *H01L 27/1255* (2013.01); *H01L 29/24* (2013.01); *H01L 29/7869* (2013.01)

(58) Field of Classification Search
CPC . H01L 27/115; H01L 21/486; H01L 27/1218; H01L 27/1255; H01L 27/124; H01L 27/1259; H01L 29/66969; G11C 11/24; G11C 11/34
See application file for complete search history.

(56) References Cited

U.S. PATENT DOCUMENTS

| | | | |
|---|---|---|---|
| 6,054,730 A * | 4/2000 | Noguchi | H01L 27/108 257/306 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,421,081 B2 | 4/2013 | Kato et al. | |
| 8,686,486 B2 | 4/2014 | Kato et al. | |
| 8,687,411 B2 | 4/2014 | Saito | |
| 8,709,889 B2 | 4/2014 | Saito | |
| 8,743,590 B2 | 6/2014 | Kurokawa | |
| 8,772,849 B2 | 7/2014 | Noda | |
| 8,780,614 B2 | 7/2014 | Takemura | |
| 8,787,102 B2 | 7/2014 | Ishizu | |
| 8,797,785 B2 | 8/2014 | Saito | |
| 8,803,142 B2 | 8/2014 | Yamazaki et al. | |
| 8,809,854 B2 | 8/2014 | Isobe et al. | |
| 8,811,064 B2 | 8/2014 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0079050 A1 * | 4/2008 | Tzeng | H01L 27/10894 257/306 |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0182110 A1 * | 7/2011 | Yamazaki | G11C 11/404 365/149 |
| 2012/0113707 A1 | 5/2012 | Takemura | |
| 2012/0127781 A1 | 5/2012 | Saito | |
| 2012/0161132 A1 | 6/2012 | Yamazaki | |
| 2012/0181534 A1 * | 7/2012 | Hatano | G11C 16/0483 257/43 |
| 2012/0188814 A1 | 7/2012 | Yamazaki et al. | |
| 2012/0213000 A1 | 8/2012 | Takemura | |
| 2012/0261664 A1 | 10/2012 | Saito | |
| 2012/0267623 A1 | 10/2012 | Isobe et al. | |
| 2012/0267709 A1 | 10/2012 | Isobe et al. | |
| 2012/0270375 A1 | 10/2012 | Sasagawa et al. | |
| 2012/0275214 A1 | 11/2012 | Atsumi et al. | |
| 2012/0287693 A1 | 11/2012 | Furutani | |
| 2012/0292615 A1 * | 11/2012 | Saito | H01L 21/84 257/43 |
| 2012/0294061 A1 | 11/2012 | Nagatsuka et al. | |
| 2012/0294068 A1 | 11/2012 | Ishizu | |
| 2012/0294069 A1 | 11/2012 | Ohmaru et al. | |
| 2012/0313762 A1 | 12/2012 | Ohshima et al. | |
| 2012/0314482 A1 | 12/2012 | Takemura | |
| 2012/0314524 A1 | 12/2012 | Takemura | |
| 2013/0069132 A1 | 3/2013 | Atsumi et al. | |
| 2013/0100723 A1 | 4/2013 | Takemura | |
| 2013/0100748 A1 | 4/2013 | Takemura | |
| 2013/0114330 A1 | 5/2013 | Takemura | |

(56) References Cited

U.S. PATENT DOCUMENTS

| | | | |
|---|---|---|---|
| 2013/0148411 A1 | 6/2013 | Atsumi et al. |
| 2013/0155790 A1 | 6/2013 | Atsumi |
| 2013/0161713 A1 | 6/2013 | Yamazaki et al. |
| 2013/0301331 A1 | 11/2013 | Onuki et al. |
| 2013/0301332 A1 | 11/2013 | Onuki |
| 2013/0308372 A1 | 11/2013 | Shionoiri et al. |
| 2013/0308392 A1 | 11/2013 | Nishijima et al. |
| 2014/0204655 A1 | 7/2014 | Saito |
| 2014/0209987 A1 | 7/2014 | Kato et al. |
| 2014/0226401 A1 | 8/2014 | Yamazaki et al. |
| 2014/0231801 A1 | 8/2014 | Saito |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-053164 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-109084 A | 6/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "BluePhase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29. No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys.Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m(m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B.(Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39. pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

US 9,825,038 B2

SEMICONDUCTOR DEVICE

CROSS-REFERENCE TO RELATED APPLICATIONS

This application is a divisional of U.S. application Ser. No. 14/471,151, filed Aug. 28, 2014, now allowed, which claims the benefit of a foreign priority application filed in Japan as Serial No. 2013-184202 on Sep. 5, 2013, both of which are incorporated by reference.

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a memory device, a driving method thereof, or a manufacturing method thereof. In particular, one embodiment of the present invention relates to a semiconductor memory device.

In this specification, a semiconductor device generally means a device which can function by utilizing semiconductor characteristics. A display device, an electro-optical device, a semiconductor circuit, and an electronic device include a semiconductor device in some cases.

2. Description of the Related Art

Dynamic random access memory (DRAM) is widely used as a main memory device of a semiconductor device. DRAM has high degree of integration and large storage capacity per unit area. However, since DRAM is a volatile memory, regular refresh operation is required to hold stored data for a long period.

In recent years, use of an oxide semiconductor for a transistor in a memory cell included in DRAM is suggested. Since the off-state current of a transistor including an oxide semiconductor in a channel formation region can be low, the interval between refresh operations can be significantly increased. Thus, power consumption of DRAM can be reduced (see Patent Document 1).

REFERENCE

Patent Document

[Patent Document 1] Japanese Published Patent Application No. 2011-109084

SUMMARY OF THE INVENTION

A conventional DRAM is mainly manufactured using a semiconductor substrate such as a silicon wafer, and transistors included in DRAM are mainly formed using a semiconductor substrate. That is, channel formation regions of transistors included in DRAM are provided in a semiconductor substrate.

On the other hand, a transistor in which a channel is formed in an oxide semiconductor has a structure different from that of a transistor in which a channel is formed in a silicon wafer in that a layer containing an oxide semiconductor is formed by deposition. Thus, it is difficult to directly apply a method for manufacturing a transistor in which a channel is formed in a silicon wafer to manufacture of a transistor in which a channel is formed in an oxide semiconductor. Therefore, in the case where DRAM is manufactured using an oxide semiconductor, a structure different from that in a convectional DRAM needs to be used.

For example, in the case where extremely minute processing is performed on a relatively thin film formed by deposition such as an oxide semiconductor layer, at the time of forming a transistor, a defect such as film peeling might occur due to insufficient adhesion of a film or the like when the size after the processing is too small.

Thus, a structure which realizes a semiconductor device having a high degree of integration and using a transistor in which a channel is formed in an oxide semiconductor is required. In other words, a structure in which a transistor where a channel is formed in an oxide semiconductor is used and extremely minute processing can be stably performed is required.

An object of one embodiment of the present invention is to improve the degree of integration in a semiconductor device using a transistor in which a channel is formed in an oxide semiconductor.

Another object of one embodiment of the present invention is to provide a novel structure in which extremely minute processing can be stably performed and the degree of integration can be increased in a semiconductor device using a transistor in which a channel is formed in an oxide semiconductor. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device in which a pair of memory cells adjacent to each other in the bit line direction is connected to the same bit line through a common contact hole in a memory cell array including a plurality of memory cells. That is, a pair of memory cells adjacent to each other in the bit line direction shares a contact hole for connection to a bit line.

One embodiment of the present invention is a semiconductor device in which a pair of memory cells adjacent to each other in the bit line direction shares an electrode connected to a bit line in a memory cell array including a plurality of memory cells. The electrode serves as a source electrode or a drain electrode of a transistor included in the memory cell.

One embodiment of the present invention is a semiconductor device in which an oxide semiconductor layer of a transistor included in a memory cell overlaps with a word line and a capacitor line which are connected to the memory cell.

According to one embodiment of the present invention, a semiconductor device includes a first transistor including a first gate, an oxide semiconductor layer overlapping with the first gate, a first electrode electrically connected to the oxide semiconductor layer, and a second electrode electrically connected to the oxide semiconductor layer; a first capacitor electrically connected to the first electrode; a second transistor including a second gate, the oxide semiconductor layer overlapping with the second gate, the second electrode, and a third electrode electrically connected to the oxide semiconductor layer; a second capacitor electrically connected to the third electrode; an insulating film over the first transistor, the first capacitor, the second transistor, and the second capacitor; and a wiring over the insulating film. The wiring is electrically connected to the second electrode through a contact hole in the insulating film.

In the above structure, the oxide semiconductor layer may overlap with the first capacitor and the second capacitor.

In any of the above structures, the first transistor, the first capacitor, the second transistor, and the second capacitor may overlap with the wiring.

In any of the above structures, the first gate may overlap with the first electrode and the second electrode and the second gate may overlap with the second electrode and the third electrode.

According to one embodiment of the present invention, a semiconductor device includes an oxide semiconductor layer; a first electrode, a second electrode, and a third electrode over the oxide semiconductor layer; a first insulating film over the oxide semiconductor layer, the first electrode, the second electrode, and the third electrode; a first wiring which is over the first insulating film and overlaps with the first electrode; a second wiring which is over the first insulating film and is between the first electrode and the second electrode; a third wiring which is over the first insulating film and is between the second electrode and the third electrode; a fourth wiring which is over the first insulating film and overlaps with the third electrode; a second insulating film over the first wiring, the second wiring, the third wiring, and the fourth wiring; and a fifth wiring over the second insulating film. The fifth wiring is electrically connected to the second electrode through a contact hole in the first insulating film and the second insulating film.

In the above structure, the oxide semiconductor layer may overlap with the first wiring, the second wiring, the third wiring, and the fourth wiring.

In any of the above structures, the fifth wiring may overlap with the oxide semiconductor layer, the first electrode, the second electrode, the third electrode, the first wiring, the second wiring, the third wiring, and the fourth wiring.

In any of the above structures, the second wiring may overlap with the first electrode and the second electrode and the third wiring may overlap with the second electrode and the third electrode.

In any of the above structures, the first electrode, the second electrode, and the third electrode may each be in contact with side surfaces of the oxide semiconductor layer.

In any of the above structures, the first insulating film may be in contact with the first electrode, the second electrode, and the third electrode.

In any of the above structures, the oxide semiconductor layer may include indium and zinc.

According to one embodiment of the present invention, a semiconductor device having a high degree of integration can be provided.

According to one embodiment of the present invention, a novel structure in which extremely minute processing can be stably performed in a manufacturing process of a semiconductor device can be provided. Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

DETAILED DESCRIPTION OF THE INVENTION

Figure 1:
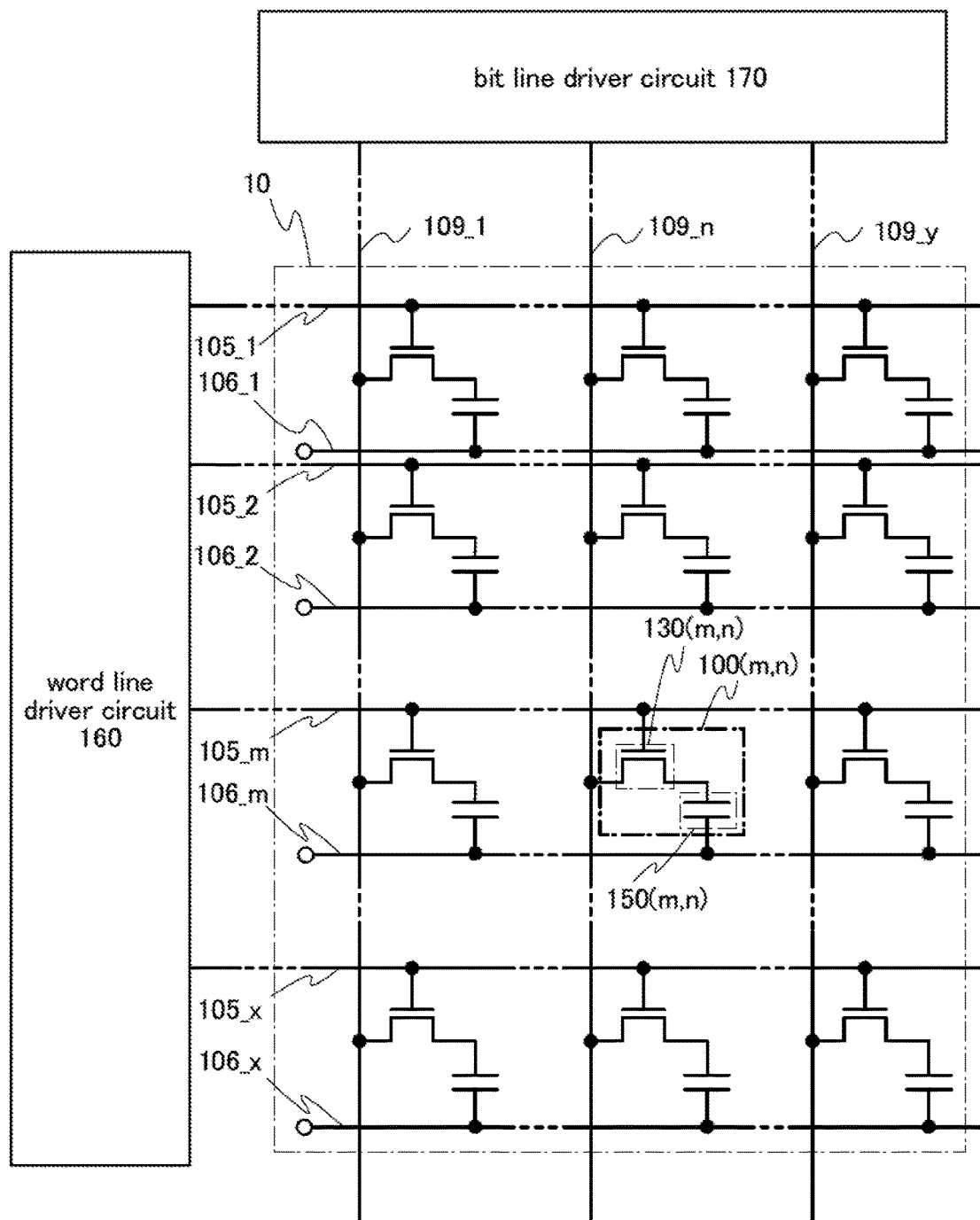
FIG. 1 is a circuit diagram illustrating one embodiment of the present invention.

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the drawings, the size, the layer thickness, or the region is exaggerated for clarity in some cases. Therefore, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel formation region between the drain (a drain terminal, a drain region, or a drain electrode) and the source (a source terminal, a source region, or a source electrode) and current can flow through the drain, the channel formation region, and the source.

In this specification and the like, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "perpendicular" indicates that the angle formed between two straight lines is greater than or equal to $80°$ and less than or equal to $100°$, and accordingly includes the case where the angle is greater than or equal to $85°$ and less than or equal to $95°$.

In this specification and the like, the trigonal and rhombohedral crystal systems are included in the hexagonal crystal system.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, the phrase "A and B are connected" or "A is connected to B" means the case where A and B are electrically connected to each other as well as the case where A and B are directly connected to each other. Here, the phrase "A and B are electrically connected" or "A is electrically connected to B" means the following case: when an object having any electrical function exists between A and B, an electric signal can be transmitted and received between A and B.

Note that in this specification, terms for describing arrangement, such as "over" and "below", are used for convenience for describing the positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

Note that the positional relations of circuit blocks in block diagrams are specified for description, and even in the case where different circuit blocks are shown to have different functions, the circuit blocks might be provided in an actual circuit or an actual region so that different functions are achieved in the same circuit or the same region. The functions of circuit blocks in block diagrams are specified for description, and even in the case where one circuit block is illustrated, circuit blocks might be provided in an actual circuit or an actual region so that processing shown to be performed by one circuit block is performed by a plurality of circuit blocks.

Embodiment 1

In this embodiment, a semiconductor device of one embodiment of the present invention and a manufacturing method thereof will be described with reference to FIG. 1, FIGS. 2A to 2D, and FIGS. 3A to 3E.

FIG. 1 illustrates an example of a circuit diagram of a memory cell array included in a semiconductor device of one embodiment of the present invention.

A memory cell array 10 includes a plurality of memory cells.

A memory cell 100($m$, $n$) included in the memory cell array 10 is electrically connected to a word line driver circuit 160 through a word line 105_$m$ and to a bit line driver circuit 170 through a bit line 109_$n$. The memory cell 100($m$, $n$) includes a transistor 130($m$, $n$) and a capacitor 150($m$, $n$). Here, m is a natural number greater than or equal to 1 and less than or equal to (x−1) and n is a natural number greater than or equal to 1 and less than or equal toy. Note that x is a natural number greater than or equal to 2 and y is a natural number greater than or equal to 1.

In a semiconductor device of one embodiment of the present invention, a pair of memory cells adjacent to each other in the bit line direction is electrically connected to the same bit line through a common contact hole. For example, the memory cell 100($m$, $n$) and a memory cell 100($m$+1, n) are electrically connected to the bit line 109_$n$ through a common contact hole.

Examples of a structure and a manufacturing method of a semiconductor device of one embodiment of the present invention will be described below with reference to FIGS. 2A to 2D and FIGS. 3A to 3E.

Figure 2A:
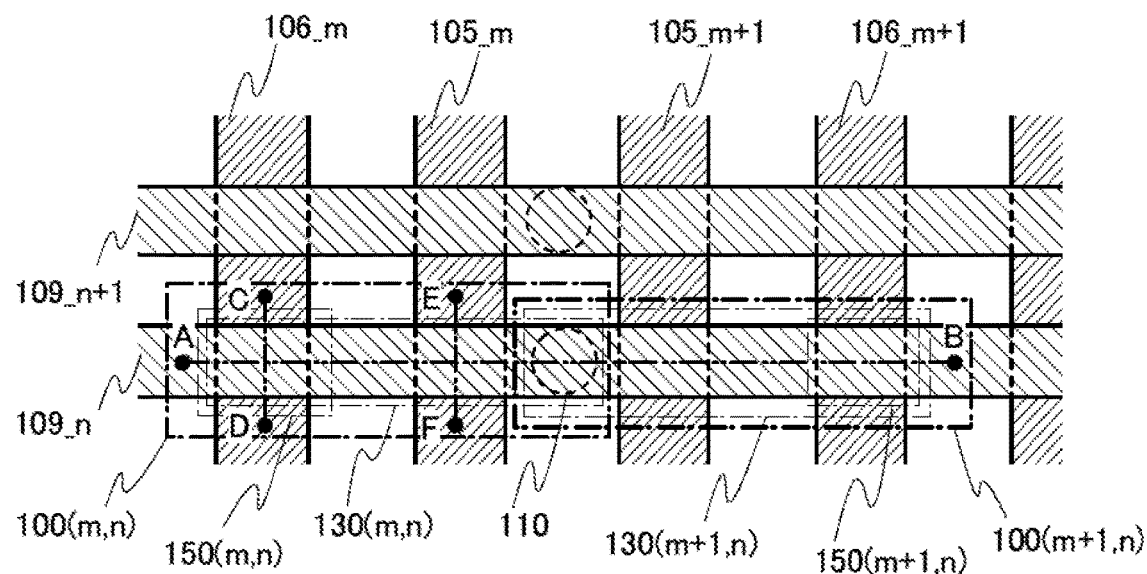
FIGS. 2A to 2D are a top view and cross-sectional views illustrating one embodiment of the present invention.
Figure 2B:
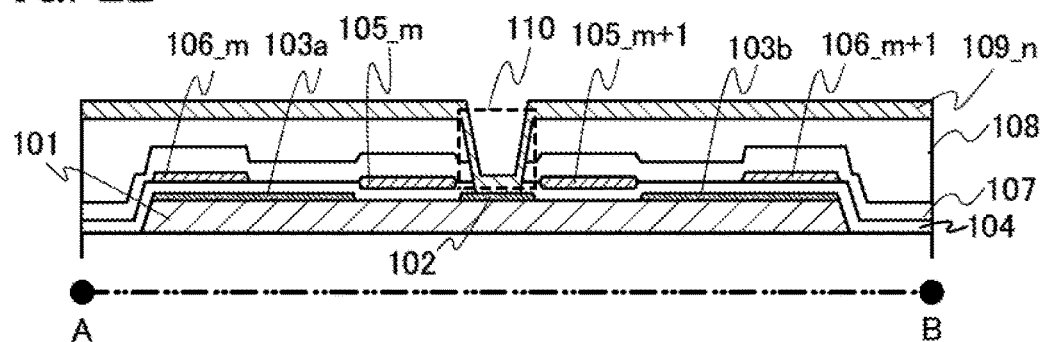
Figure 2C:
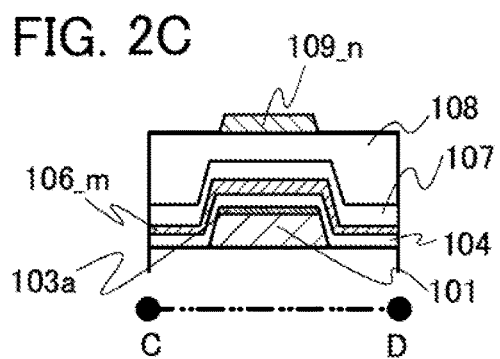
Figure 2D:
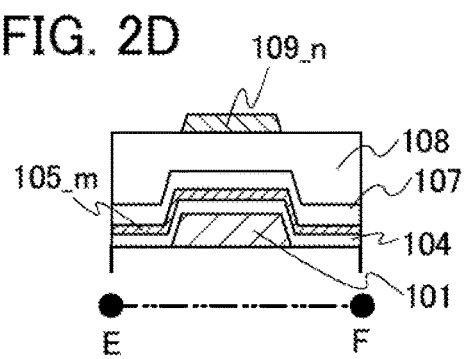

FIGS. 2A to 2D are a top view and cross-sectional views of part of a memory cell array of a semiconductor memory device as an example of a semiconductor memory device of one embodiment of the present invention. Here, FIG. 2A is a top view, FIG. 2B is a cross-sectional view taken along A-B in FIG. 2A, FIG. 2C is a cross-sectional view taken along C-D in FIG. 2A, and FIG. 2D is a cross-sectional view taken along E-F in FIG. 2A.

FIGS. 2A to 2D illustrate the memory cell 100($m$, $n$), the memory cell 100($m$+1, n), the word line 105_$m$, a word line 105_$m$+1, a capacitor line 106_$m$, a capacitor line 106_$m$+1, the bit line 109_$n$, and a bit line 109_$n$+1 which are included in the memory cell array 10. The memory cell 100($m$, $n$) includes the transistor 130($m$, $n$) and the capacitor 150($m$, $n$). Similarly, the memory cell 100($m$+1, n) includes a transistor 130($m$+1, n) and a capacitor 150($m$+1, n).

As illustrated in FIG. 2A, the word line 105_$m$, the word line 105_$m$+1, the capacitor line 106_$m$, and the capacitor line 106_$m$+1 are provided in parallel to each other, and the bit line 109_$n$ and the bit line 109_$n$+1 are provided along the direction perpendicular to the word line 105_$m$, the word line 105_$m$+1, the capacitor line 106_$m$, and the capacitor line 106_$m$+1. Note that in FIG. 2A, the other components are omitted for simplification.

In this embodiment, the memory cell 100($m$, $n$) and the memory cell 100($m$+1, n) share part of the structure. Hereinafter, description is made with reference to the cross-sectional views of FIGS. 2B to 2D.

A semiconductor device of one embodiment of the present invention includes an oxide semiconductor layer 101, an electrode 102, an electrode 103$a$, an electrode 103$b$, an insulating film 104, the word line 105_$m$, the word line 105_$m$+1, the capacitor line 106_$m$, the capacitor line 106_$m$+1, an insulating film 107, an insulating film 108, and the bit line 109_$n$ (see FIG. 2B).

The oxide semiconductor layer 101 includes channel formation regions of the transistor 130($m$, $n$) and the transistor 130($m$+1, n), and each of the channel formation regions overlaps with the bit line 109_$n$. The channel formation region of the transistor 130($m$, $n$) is a region of the oxide semiconductor layer 101 between the electrode 102 and the electrode 103$a$, and the channel formation region of the transistor 130($m$+1, n) is a region of the oxide semiconductor layer 101 between the electrode 102 and the electrode 103$b$.

Furthermore, the transistor 130($m$, $n$) and the capacitor 150($m$, $n$) share the electrode 103$a$. In other words, the electrode 103$a$ serves as a source electrode or a drain electrode of the transistor 130($m$, $n$) and one of a pair of electrodes of the capacitor 150($m$, $n$).

Similarly, the transistor 130($m$+1, n) and the capacitor 150($m$+1, n) share the electrode 103$b$. In other words, the electrode 103$b$ serves as a source electrode or a drain electrode of the transistor 130($m$+1, n) and one of a pair of electrodes of the capacitor 150($m$+1, n).

On the other hand, the electrode 102 and the electrode 103$a$ serve as the source electrode and the drain electrode of the transistor 130($m$, $n$) and the electrode 102 and the electrode 103$b$ serve as the source electrode and the drain electrode of the transistor 130($m$+1, n). That is, the transistor 130($m$, $n$) and the transistor 130($m$+1, n) share the electrode 102.

The word line 105_$m$ also serves as a gate of the transistor 130($m$, $n$) and the capacitor line 106_$m$ also serves as the other of the pair of electrodes of the capacitor 150($m$, $n$).

Similarly, the word line 105_m+1 serves as a gate of the transistor 130(m+1, n) and the capacitor line 106_m+1 also serves as the other of the pair of electrodes of the capacitor 150(m+1, n).

As illustrated in FIG. 2A, the transistor 130(m, n), the capacitor 150(m, n), the transistor 130(m+1, n), and the capacitor 150(m+1, n) are provided to overlap with the bit line 109_n and the channel length direction of the transistor 130(m, n) and that of the transistor 130(m+1, n) are parallel to the bit line 109_n.

The bit line 109_n is electrically connected to the electrode 102 through the contact hole 110 provided in the insulating film 104, the insulating film 107, and the insulating film 108.

The oxide semiconductor layer 101 is provided to overlap with not only the electrode 102, the electrode 103a, and the electrode 103b but also the capacitor line 106_m, the capacitor line 106_m+1, and the contact hole 110. In other words, the electrode 103a and the insulating film 104 are located between the oxide semiconductor layer 101 and the capacitor line 106_m, and the electrode 103b and the insulating film 104 are located between the oxide semiconductor layer 101 and the capacitor line 106_m+1. The electrode 102 is located between the oxide semiconductor layer 101 and the bit line 109_n.

The capacitor line 106_m is provided to face not only a top surface of the electrode 103a but also side surfaces of the electrode 103a and side surfaces the oxide semiconductor layer 101 (see FIG. 2C).

Furthermore, the word line 105_m is provided to face not only a top surface of the oxide semiconductor layer 101 but also side surfaces of the oxide semiconductor layer 101 (see FIG. 2D).

Similarly, the capacitor line 106_m+1 is provided to face not only a top surface of the electrode 103b but also side surfaces of the electrode 103b and the side surfaces of the oxide semiconductor layer 101. The word line 105_m+1 is provided to face not only the top surface of the oxide semiconductor layer 101 but also the side surfaces of the oxide semiconductor layer 101 (not illustrated).

When a pair of memory cells adjacent to each other in the bit line direction is electrically connected to the same bit line through a common contact hole, the area occupied by the memory cell can be reduced, so that higher integration of the memory cell array can be achieved.

Furthermore, by providing the oxide semiconductor layer 101 to overlap with the capacitor line 106_m, the capacitor line 106_m+1, and the contact hole 110, the area occupied by the oxide semiconductor layer 101 in the memory cell 100(m, n) and the memory cell 100(m+1, n) can be increased without an increase in the size of the memory cell. Thus, even in the case where minute processing is performed, the oxide semiconductor layer can be processed precisely.

Next, a method for manufacturing the structure illustrated in FIGS. 2A to 2D is described with reference to FIGS. 3A to 3E.

Figure 3A:
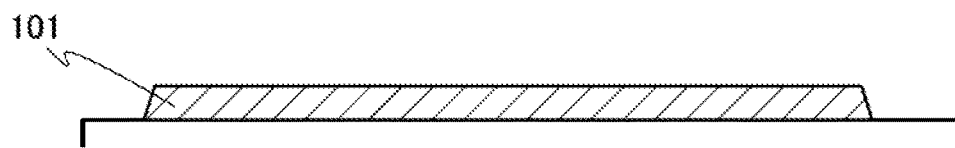
FIGS. 3A to 3E illustrate a manufacturing method of one embodiment of the present invention.

First, the oxide semiconductor layer 101 is formed (see FIG. 3A). The oxide semiconductor layer 101 may be formed on an insulating surface. As examples of the insulating surface on which the oxide semiconductor layer 101 is formed, a surface of a substrate having an insulating property and a surface of an insulating film can be given.

Although there is no particular limitation on a material that can be used as the substrate having an insulating property, it is necessary that the material have at least heat resistance high enough to withstand heat treatment to be performed later. For example, a glass substrate formed by a fusion process or a float process, a quartz substrate, or a ceramic substrate can be used. In the case where the temperature of the heat treatment to be performed later is high, a glass substrate whose strain point is 730° C. or higher is preferably used as a glass substrate. Although a substrate formed of a flexible synthetic resin such as plastic generally has a lower heat resistance temperature than the aforementioned substrates, it may be used as long as being resistant to a processing temperature during manufacturing steps.

As the insulating film, an insulating film containing silicon oxide, silicon oxynitride, aluminum oxide, hafnium oxide, gallium oxide, silicon nitride, silicon nitride oxide, or the like may be used. Note that in this specification and the like, "silicon oxynitride" contains more oxygen than nitrogen, and "silicon nitride oxide" contains more nitrogen than oxygen.

The oxide semiconductor layer 101 is a layer containing an oxide semiconductor. An oxide semiconductor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As an oxide semiconductor used for the oxide semiconductor layer of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

When the oxide semiconductor film forming the oxide semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (also referred to as dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

In this manner, the transistor including an i-type or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1\times10^{-18}$ A, preferably less than or equal to $1\times10^{-21}$ A, more preferably $1\times10^{-24}$ A; or at 85° C., less than or equal to $1\times10^{-15}$ A, preferably $1\times10^{-18}$ A, more preferably less than or equal to $1\times10^{-21}$ A. An off state of a transistor refers to a state where a gate voltage is much lower than the threshold voltage in an n-channel transistor. Specifically, when the gate voltage is lower than the threshold voltage by 1 V or more, 2 V or more, or 3 V or more, the transistor is off.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a poly-crystalline oxide semiconductor film, a microcrystalline oxide semiconductor film, an amorphous oxide semiconductor film, and the like.

First, a CAAC-OS film is described.

The CAAC-OS film is one of oxide semiconductor films including a plurality of c-axis aligned crystal parts.

In a transmission electron microscope (TEM) image of the CAAC-OS film, it is difficult to clearly observe a boundary between crystal parts, that is, a grain boundary. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

From the results of the cross-sectional TEM image and the plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm2 or more, 5 μm2 or more, or 1000 μm2 or more is observed in some cases in the plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Furthermore, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Furthermore, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film is described.

In an image obtained with the TEM, it is difficult to observe crystal parts clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film In an image obtained with TEM, it is difficult to find a grain boundary clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., greater than or equal to 50 nm) larger than the diameter of a crystal part. Meanwhile, spots are shown in a nanobeam electron diffraction pattern of the nc-OS film obtained by using an electron beam having a probe diameter (e.g., greater than or equal to 1 nm and smaller than or equal to 30 nm) close to, or smaller than or equal to the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

The oxide semiconductor layer 101 can be formed in such a manner that the above-described oxide semiconductor film is formed and selectively removed by etching.

Figure 3B:
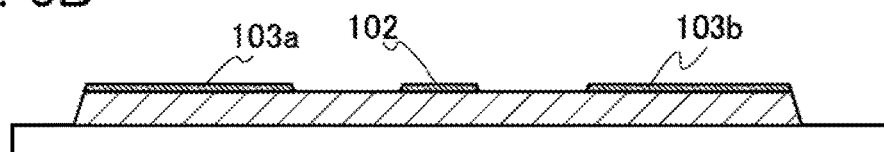

Next, the electrode 102, the electrode 103a, and the electrode 103b are formed over the oxide semiconductor layer 101 (see FIG. 3B). The electrode 102, the electrode 103a, and the electrode 103b can be formed at the same time in such a manner that a conductive film is formed over the oxide semiconductor layer 101 and selectively removed by etching.

The electrode 102, the electrode 103a, and the electrode 103b are not limited to a single conductive film, and may have a structure in which a plurality of conductive films are stacked. The plurality of conductive films may have different materials. As the conductive film, at least one of elements such as aluminum, chromium, copper, tantalum, titanium, molybdenum, tungsten, iridium, and tin is contained as its main component. Furthermore, the conductive film can be formed using an oxide or nitride thereof as long as it has conductivity. As examples thereof, an indium tin oxide (ITO), tantalum nitride, and titanium nitride can be given.

Next, the insulating film 104 covering the oxide semiconductor layer 101, the electrode 102, the electrode 103a, and the electrode 103b is formed.

The insulating film 104 can be formed by a CVD method, a sputtering method, or the like. The insulating film 104 is preferably formed so as to contain silicon oxide, silicon nitride, silicon oxynitride, gallium oxide, aluminum oxide, tantalum oxide, hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. The insulating film 104 may have a single-layer structure or a stacked structure using any of the above materials. There is no particular limitation on the thickness; however, in the case where the memory device is miniaturized, the thickness of the insulating layer is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

When the insulating film is thin as in the above description, a problem of gate leakage due to a tunneling effect or the like is caused. In order to solve the problem of gate leakage, the insulating film 104 may be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. By using a high-k material for the insulating film 104, the thickness of the insulating film 104 can be large to prevent gate leakage. Note that a stacked structure of a film containing a high-k material and a film containing any of silicon oxide, silicon nitride, silicon oxynitride, silicon nitride oxide, aluminum oxide, and the like may be employed.

Furthermore, the insulating film 104 may be formed using an insulating material containing a Group 13 element and oxygen. Many oxide semiconductor materials contain a Group 13 element, and an insulating material containing a Group 13 element works well with an oxide semiconductor. By using such an insulating material containing a Group 13 element for the insulating film that is in contact with the oxide semiconductor layer, the state of an interface with the oxide semiconductor layer can be kept well.

An insulating material containing a Group 13 element is an insulating material containing one or more Group 13 elements. As the insulating material containing a Group 13 element, gallium oxide, aluminum oxide, aluminum gallium oxide, and gallium aluminum oxide are given, for example. Here, the amount of aluminum is larger than that of gallium in atomic percent in aluminum gallium oxide, whereas the amount of gallium is larger than or equal to that of aluminum in atomic percent in gallium aluminum oxide.

For example, in the case of forming an insulating film in contact with an oxide semiconductor layer containing gallium, a material containing gallium oxide may be used for the insulating film, so that favorable characteristics can be kept at the interface between the oxide semiconductor layer and the insulating film. The oxide semiconductor layer and an insulating film containing gallium oxide are provided in contact with each other, so that pileup of hydrogen at the interface between the oxide semiconductor layer and the insulating film can be reduced. Note that a similar effect can be obtained in the case where an element in the same group as a constituent element of the oxide semiconductor is used in the insulating film. For example, it is effective to form an insulating film with the use of a material containing aluminum oxide. Note that water is less likely to permeate aluminum oxide, and it is therefore preferable to use a material containing aluminum oxide in terms of preventing entry of water into the oxide semiconductor layer.

The insulating film which is in contact with the oxide semiconductor layer 101 preferably contains oxygen in a proportion higher than the stoichiometric composition by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film in contact with the oxide semiconductor layer 101 is formed using gallium oxide, the composition of gallium oxide can be set to be Ga$_2$O$_X$ (X=3+α, 0<α<1) by heat treatment in an oxygen atmosphere or by oxygen doping. In the case where the insulating film in contact with the oxide semiconductor layer 101 is formed using aluminum oxide, the composition of aluminum oxide can be set to be Al$_2$O$_X$ (X=3+α, 0<α<1) by heat treatment in an oxygen atmosphere or by oxygen doping. In the case where the insulating film in contact with the oxide semiconductor layer 101 is formed using gallium aluminum oxide (aluminum gallium oxide), the composition of gallium aluminum oxide (aluminum gallium oxide) can be set to be Ga$_X$Al$_{2-X}$O$_{3+α}$ (0<X<2, 0<α<1) by heat treatment in an oxygen atmosphere or by oxygen doping.

By oxygen doping or the like, an insulating film that includes a region where the proportion of oxygen is higher than that in the stoichiometric composition can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

In the case where the oxide semiconductor layer 101 is formed over the insulating film, the insulating layer which includes a region where the proportion of oxygen is higher than that in the stoichiometric composition may be applied to the insulating film which serves as a base film of the oxide semiconductor layer 101, instead of the insulating film 104, or may be applied to both the insulating film 104 and the insulating film which serves as the base film.

After the insulating film 104 is formed, heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. for an hour in a nitrogen atmosphere. By performing the heat treatment, variation in electrical characteristics of the transistor can be reduced. Moreover, in the case where the insulating film 104 includes oxygen, oxygen is supplied to the oxide semiconductor layer 101 to compensate oxygen vacancies in the oxide semiconductor layer 101, whereby an i-type (intrinsic) or substantially i-type oxide semiconductor layer can be formed.

In this embodiment, the heat treatment is performed after the insulating film 104 is formed; however, the timing of the heat treatment is not limited to this. For example, the heat treatment may be performed after the word line or the capacitor line to be formed later is formed.

By performing the heat treatment as described above, the oxide semiconductor layer 101 can be highly purified so as to include substances including a hydrogen atom as little as possible.

Figure 3C:
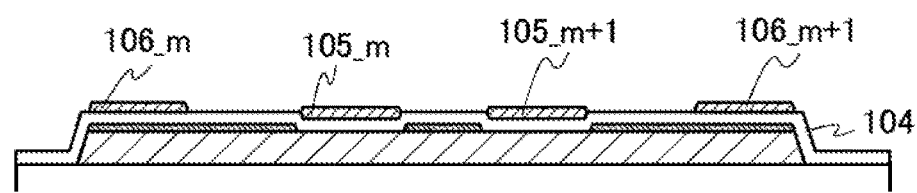

Next, the word line 105_$m$, the capacitor line 106_$m$, the word line 105_$m$+1, and the capacitor line 106_$m$+1 are formed over the insulating film 104 (see FIG. 3C). The word line 105_$m$, the capacitor line 106_$m$, the word line 105_$m$+1, and the capacitor line 106_$m$+1 can be formed at the same time in such a manner that a conductive film is formed over the insulating film 104 and is selectively removed by etching. The word line 105_$m$, the capacitor line 106_$m$, the word line 105_$m$+1, and the capacitor line 106_$m$+1 are formed in parallel to one another.

In that case, the word line 105_$m$ is formed between the capacitor line 106_$m$ and the word line 105_$m$+1, and the word line 105_$m$+1 is formed between the capacitor line 106_$m$+1 and the word line 105$m$.

The word line 105_$m$, the capacitor line 106_$m$, the word line 105_$m$+1, and the capacitor line 106_$m$+1 are not limited to a single conductive film, and may have a structure in which a plurality of conductive films are stacked. The plurality of conductive films may have different materials. As the conductive film, at least one of elements such as aluminum, chromium, copper, tantalum, titanium, molybdenum, tungsten, iridium, and tin is contained as its main component. Furthermore, the conductive film can be formed using an oxide or nitride thereof as long as it has conductivity. As examples thereof, an indium tin oxide (ITO), tantalum nitride, and titanium nitride can be given.

The word line 105_$m$ is formed in a region between the electrode 102 and the electrode 103$a$ to overlap with the oxide semiconductor layer 101. In that case, the word line 105_$m$ faces not only the top surface of the oxide semiconductor layer 101 but also the side surfaces of the oxide semiconductor layer 101 with the insulating film 104 provided therebetween. Similarly, the word line 105_$m$+1 is formed in a region between the electrode 102 and the electrode 103$b$ to overlap with the oxide semiconductor layer 101. In that case, the word line 105_$m$+1 faces not only the top surface of the oxide semiconductor layer 101 but also the side surfaces of the oxide semiconductor layer 101 with the insulating film 104 provided therebetween.

On the other hand, the capacitor line 106_$m$ is formed to overlap with the electrode 103$a$. In that case, the capacitor line 106_$m$ also overlaps with the oxide semiconductor layer 101. In other words, the capacitor line 106_$m$ is formed so that the electrode 103$a$ and the insulating film 104 are located between the capacitor line 106_$m$ and the oxide semiconductor layer 101. Furthermore, the capacitor line 106_$m$ faces the side surfaces of the electrode 103$a$ and the side surfaces of the oxide semiconductor layer 101 with the insulating film 104 provided therebetween. Similarly, the capacitor line 106_$m$+1 is formed to overlap with the electrode 103$b$. In that case, the capacitor line 106_$m$+1 also overlaps with the oxide semiconductor layer 101. In other words, the capacitor line 106_$m$+1 is formed so that the electrode 103$b$ and the insulating film 104 are located between the capacitor line 106_$m$+1 and the oxide semiconductor layer 101. Furthermore, the capacitor line 106_$m$+1 faces the side surfaces of the electrode 103$b$ and the side surfaces of the oxide semiconductor layer 101 with the insulating film 104 provided therebetween.

Figure 3D:
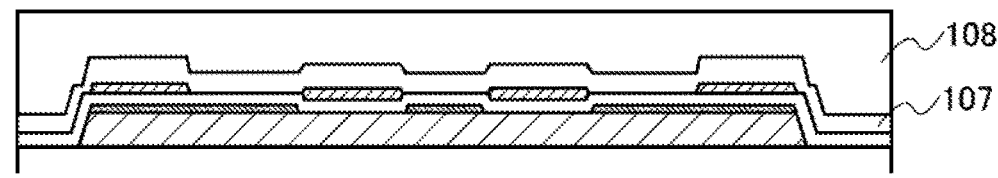

Next, the insulating film 107 and the insulating film 108 are stacked over the word line 105_$m$, the capacitor line 106_$m$, the word line 105_$m$+1, and the capacitor line 106_$m$+1 (see FIG. 3D). Note that in this embodiment, a structure in which one of the insulating film 107 and the insulating film 108 is not necessarily formed or a structure of three layers or more in which another insulating film is further formed over the insulating film 108 may be employed.

As each of the insulating films 107 and 108, an insulating film containing silicon oxide, silicon oxynitride, aluminum oxide, hafnium oxide, gallium oxide, silicon nitride, silicon nitride oxide, or the like can be used. The insulating film 107 and the insulating film 108 may be formed using different materials.

Furthermore, as each of the insulating films 107 and 108, an organic insulating film can be used. As the organic insulating film, an acrylic resin, an epoxy resin, polyamide, polyimide, or a benzocyclobutene-based resin can be used, for example.

Next, the insulating film 104, the insulating film 107, and the insulating film 108 are etched, so that the contact hole 110 reaching the electrode 102 is formed. The contact hole 110 may be formed in such a manner that the insulating film 104, the insulating film 107, and the insulating film 108 are selectively removed by dry etching.

The contact hole 110 is formed in a region between the word line 105_$m$ and the word line 105_$m$+1.

Figure 3E:
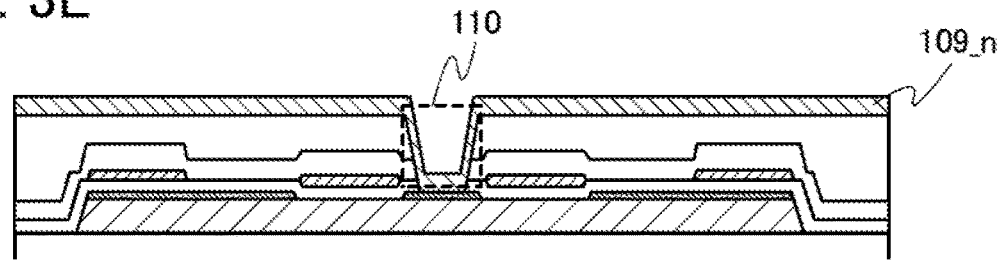

After the contact hole 110 is formed, the bit line 109_$n$ is formed (see FIG. 3E). The bit line 109_$n$ can be formed in such a manner that a conductive film is formed over the insulating film 108 and selectively removed by etching. The bit line 109_$n$ is electrically connected to the electrode 102 through the contact hole 110.

The bit line 109_$n$ is formed in the direction perpendicular to the word line 105_$m$, the capacitor line 106_$m$, the word line 105_$m$+1, and the capacitor line 106_$m$+1. Furthermore, the bit line 109_$n$ is formed to overlap with the oxide semiconductor layer 101. Thus, when the memory cell 100($m$, n) and the memory cell 100($m$+1, n) are seen from the direction perpendicular to a formation surface of the oxide semiconductor layer 101, a channel formation region of the transistor 130($m$, $n$) overlaps with a region where the word line 105_$m$ and the bit line 109_$n$ are overlapped with each other and a channel formation region of the transistor 130($m$+1, n) overlaps with a region where the word line 105_$m$+1 and the bit line 109_$n$ are overlapped with each other.

The bit line 109_$n$ is not limited to a single conductive film, and may have a structure in which a plurality of conductive films are stacked. The plurality of conductive films may have different materials. As the conductive film, at least one of elements such as aluminum, chromium, copper, tantalum, titanium, molybdenum, tungsten, iridium, and tin is contained as a main component. Furthermore, the conductive film can be formed using an oxide or nitride thereof as long as it has conductivity. As examples thereof, an indium tin oxide (ITO), tantalum nitride, and titanium nitride can be given.

By the above-described method, the structure illustrated in FIGS. 2A to 2D can be formed. In a memory cell array having the structure illustrated in FIGS. 2A to 2D, a pair of memory cells adjacent to each other in the bit line direction is electrically connected to a bit line through a common contact hole; thus, higher integration can be achieved. For example, when the minimum feature size is F, in the memory cell array having the above-described structure, the area occupied by a memory cell can be 8 $F^2$.

Since the memory cell array having the structure illustrated in FIGS. 2A to 2D includes a transistor using an oxide semiconductor, power consumption can be reduced.

In addition, the memory cell array having the structure illustrated in FIGS. 2A to 2D includes a relatively large oxide semiconductor layer; thus, even in minute processing, defects due to insufficient adhesion and the like can be reduced. Accordingly, the structure described in this embodiment can achieve high yield and high integration.

Note that this embodiment can be combined with any of the other embodiments as appropriate.

Embodiment 2

In this embodiment, an example of a semiconductor device having a shape different from that in the above embodiment is shown.

A semiconductor device of one embodiment of the present invention disclosed in this embodiment has a structure in which part of an insulating film included in a capacitor or a transistor is removed and an insulating film provided over a wiring included in the capacitor or the transistor is in contact with an electrode included in the capacitor or the transistor.

An example of the semiconductor device disclosed in this embodiment is described with reference to FIGS. 4A to 4D. Note that the same reference numerals are used for portions in common with those in the above embodiment.

Figure 4A:
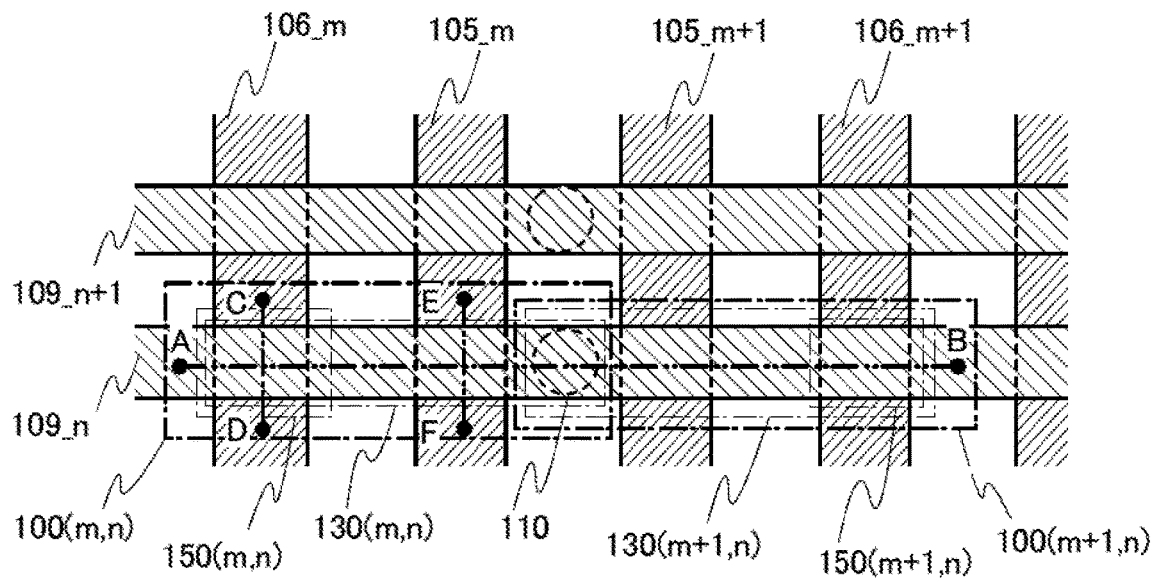
FIGS. 4A to 4D are a top view and cross-sectional views illustrating one embodiment of the present invention.
Figure 4B:
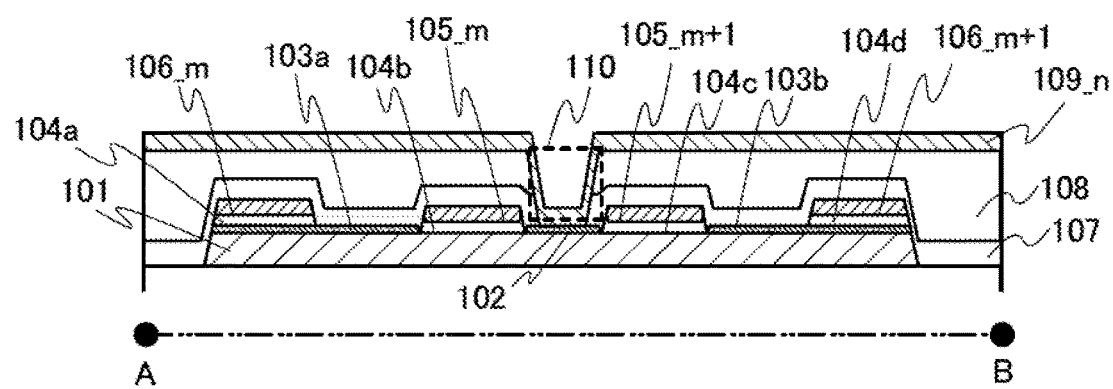
Figure 4C:
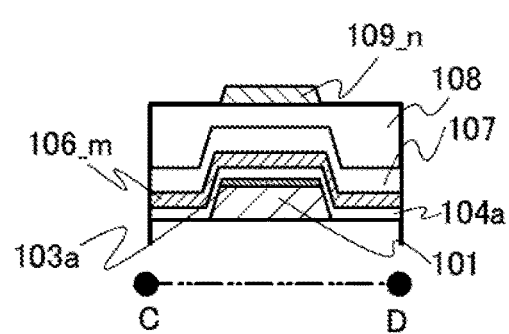
Figure 4D:
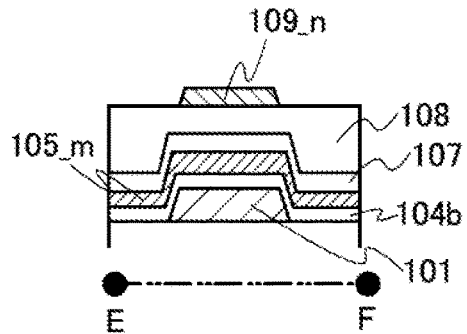

FIGS. 4A to 4D are a top view and cross-sectional views of part of a memory cell array of a semiconductor memory device as an example of a semiconductor memory device of one embodiment of the present invention. Here, FIG. 4A is a top view, FIG. 4B is a cross-sectional view taken along A-B in FIG. 4A, FIG. 4C is a cross-sectional view taken along C-D in FIG. 4A, and FIG. 4D is a cross-sectional view taken along E-F in FIG. 4A.

As illustrated in FIG. 4A, the word line 105_$m$, the word line 105_$m$+1, the capacitor line 106_$m$, and the capacitor line 106_$m$+1 are provided in parallel to one another, and the bit line 109_$n$ and the bit line 109_$n$+1 are provided along the direction perpendicular to the word line 105_$m$, the word line 105_$m$+1, the capacitor line 106_$m$, and the capacitor line 106_$m$+1. Note that in FIG. 4A, the other components are omitted for simplification.

In this embodiment, the oxide semiconductor layer 101, the electrode 102, the electrode 103$a$, the electrode 103$b$, an insulating film 104$a$, an insulating film 104$b$, an insulating film 104$c$, an insulating film 104$d$, the word line 105_$m$, the word line 105_$m$+1, the capacitor line 106_$m$, the capacitor line 106_$m$+1, the insulating film 107, the insulating film 108, and the bit line 109_$n$ are included (see FIG. 4B).

In other words, in this embodiment, the insulating film 104$a$, the insulating film 104$b$, the insulating film 104$c$, and the insulating film 104$d$ are provided instead of the insulating film 104 in Embodiment 1.

The insulating film 104$a$ is provided to overlap with the capacitor line 106_$m$ and is located between the capacitor line 106_$m$, and the electrode 103$a$ or the oxide semiconductor layer 101 in the capacitor 150($m$, $n$).

The insulating film 104$b$ is provided to overlap with the word line 105_$m$ and is located between the oxide semiconductor layer 101 and the word line 105_$m$ in the transistor 130($m$, $n$).

The insulating film 104$c$ is provided to overlap with the word line 105_$m$+1 and is located between the oxide semiconductor layer 101 and the word line 105_$m$+1 in the transistor 130($m$+1, $n$).

The insulating film 104$d$ is provided to overlap with the capacitor line 106_$m$+1 and is located between the capacitor line 106_$m$+1, and the electrode 103$b$ or the oxide semiconductor layer 101 in the capacitor 150($m$+1, $n$).

Furthermore, the insulating film 107 is in contact with the electrode 103$a$ in a region between the word line 105_$m$ and the capacitor line 106_$m$, and the insulating film 107 is in contact with the electrode 103$b$ in a region between the word line 105_$m$+1 and the capacitor line 106_$m$+1.

In the side surfaces of the oxide semiconductor layer 101, the oxide semiconductor layer 101 is in contact with the insulating film 107 in a region overlapping with none of the word line 105_$m$, the capacitor line 106_$m$, the word line 105_$m$+1, and the capacitor line 106_$m$+1, that is, a region overlapping with none of the insulating film 104$a$, the insulating film 104$b$, the insulating film 104$c$, and the insulating film 104$d$.

The bit line 109_$n$ is electrically connected to the electrode 102 through the contact hole 110 provided in the insulating film 107 and the insulating film 108.

The capacitor line 106_$m$ is provided to face not only the top surface of the electrode 103$a$ but also the side surfaces of the electrode 103$a$ and the side surfaces of the oxide semiconductor layer 101 (see FIG. 4C). The insulating film 104$a$ is located between the capacitor line 106_$m$ and the side surfaces of the electrode 103$a$ and the side surfaces of the oxide semiconductor layer 101.

Furthermore, the word line 105_$m$ is provided to face not only the top surface of the oxide semiconductor layer 101 but also the side surfaces of the oxide semiconductor layer 101 (see FIG. 4D). The insulating film 104$b$ is located between the side surfaces of the oxide semiconductor layer 101 and the word line 105_$m$.

Similarly, the capacitor line 106_$m$+1 is provided to face not only the top surface of the electrode 103$b$ but also the side surfaces of the electrode 103$b$ and the side surfaces of the oxide semiconductor layer 101. The word line 105_$m$+1 is provided to face not only the top surface of the oxide semiconductor layer 101 but also the side surfaces of the oxide semiconductor layer 101 (not illustrated). The insulating film 104$c$ is located between the side surfaces of the oxide semiconductor layer 101 and the word line 105_$m$+1, and the insulating film 104$d$ is located between the capacitor line 106_$m$+1 and the side surfaces of the oxide semiconductor layer 101 and the side surfaces of the electrode 103$b$.

Next, an example of a method for manufacturing the structure in this embodiment is described. The description of the same portions as those in the above embodiment is omitted.

First, the structure illustrated in FIG. 3C is manufactured by the method described in Embodiment 1.

Next, the insulating film 104 is selectively removed by etching using the word line 105_$m$, the capacitor line 106_$m$, the word line 105_$m$+1, and the capacitor line 106_$m$+1 as masks. Regions of the insulating film 104 which are not covered with the word line 105_$m$, the capacitor line 106_$m$, the word line 105_$m$+1, and the capacitor line 106_$m$+1 are removed, and the insulating film 104$b$ overlapping with the word line 105_$m$, the insulating film 104$a$ overlapping with the capacitor line 106_m, the insulating film 104c overlapping with the word line 105_m+1, and the insulating film 104d overlapping with the capacitor line 106_m+1 are formed.

Next, the insulating film 107 and the insulating film 108 are stacked over the word line 105_m, the capacitor line 106_m, the word line 105_m+1, and the capacitor line 106_m+1. The insulating film 107 and the insulating film 108 may be formed using a material and a method which are similar to those in Embodiment 1.

The contact hole 110 and the bit line 109_n are formed using materials and methods which are similar to those in Embodiment 1.

By the above-described method, the structure illustrated in FIGS. 4A to 4D can be formed. In a memory cell array having the structure illustrated in FIGS. 4A to 4D, a pair of memory cells adjacent to each other in the bit line direction is electrically connected to a bit line through a common contact hole; thus, higher integration can be achieved. For example, when the minimum feature size is F, in the memory cell array having the above-described structure, the area occupied by a memory cell can be 8 $F^2$.

Since the memory cell array having the structure illustrated in FIGS. 4A to 4D includes a transistor using an oxide semiconductor, power consumption can be reduced.

In addition, the memory cell array having the structure illustrated in FIGS. 4A to 4D includes a relatively large oxide semiconductor layer; thus, even in minute processing, defects due to insufficient adhesion and the like can be reduced. Accordingly, the structure described in this embodiment can achieve high yield and high integration.

Note that this embodiment can be combined with any of the other embodiments as appropriate.

Embodiment 3

In this embodiment, an example of a semiconductor device having a shape different from that in the above embodiment and an example of a manufacturing method thereof are shown.

A semiconductor device of one embodiment of the present invention disclosed in this embodiment has a structure in which an electrode included in a transistor and a capacitor which are in a memory cell is provided to overlap with not only a top surface of an oxide semiconductor layer and but also side surfaces thereof.

An example of the semiconductor device disclosed in this embodiment is described with reference to FIGS. 5A to 5D. Note that the same reference numerals are used for portions in common with those in the above embodiments.

Figure 5A:
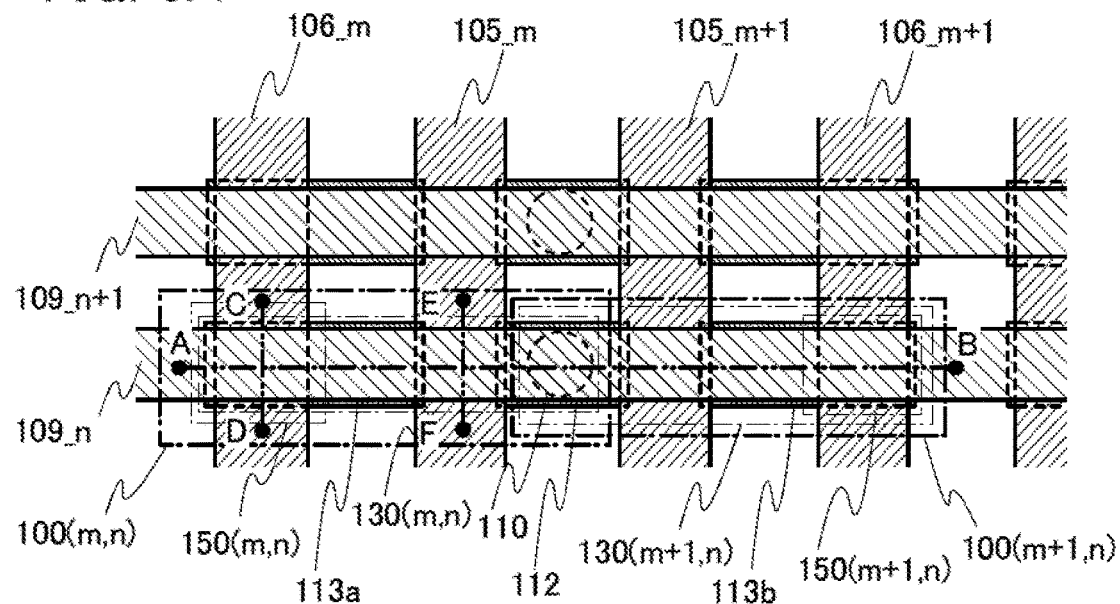
FIGS. 5A to 5D are a top view and cross-sectional views illustrating one embodiment of the present invention.
Figure 5B:
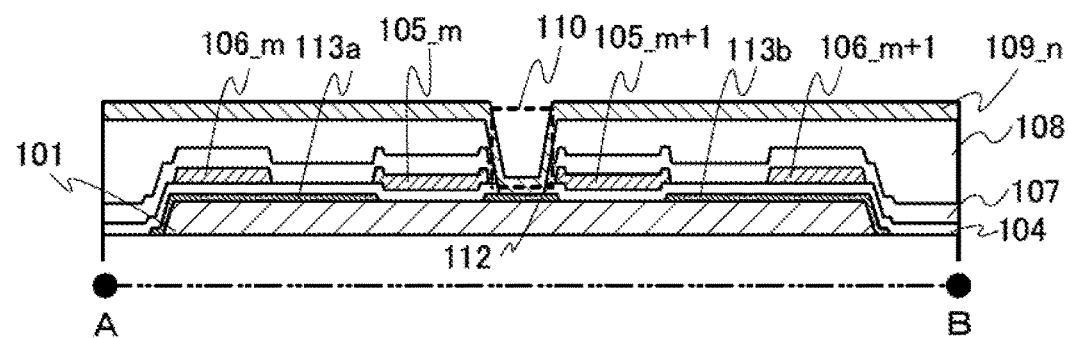
Figure 5C:
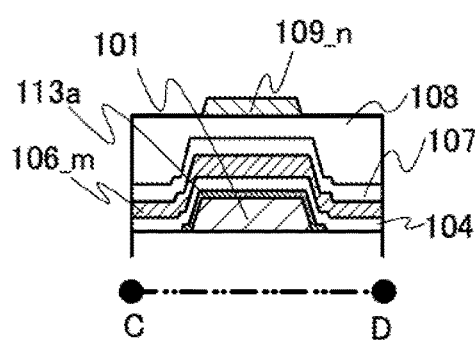
Figure 5D:
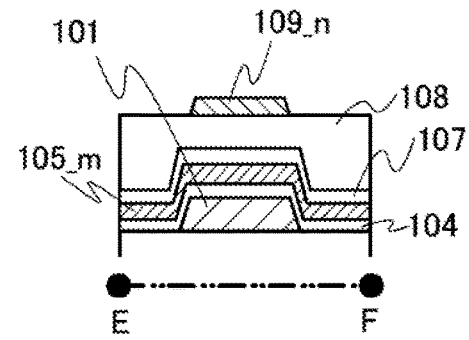

FIGS. 5A to 5D are a top view and cross-sectional views of part of a memory cell array of a semiconductor memory device as an example of a semiconductor memory device of one embodiment of the present invention. Here, FIG. 5A is a top view, FIG. 5B is a cross-sectional view taken along A-B in FIG. 5A, FIG. 5C is a cross-sectional view taken along C-D in FIG. 5A, and FIG. 5D is a cross-sectional view taken along E-F in FIG. 5A.

As illustrated in FIG. 5A, the word line 105_m, the word line 105_m+1, the capacitor line 106_m, and the capacitor line 106_m+1 are provided in parallel to one another, and the bit line 109_n and the bit line 109_n+1 are provided along the direction perpendicular to the word line 105_m, the word line 105_m+1, the capacitor line 106_m, and the capacitor line 106_m+1. Parts of an electrode 112, an electrode 113a, and an electrode 113b are provided also in a region outside the bit line 109_n in the top view in FIG. 5A.

In this embodiment, the oxide semiconductor layer 101, the electrode 112, the electrode 113a, the electrode 113b, the insulating film 104, the word line 105_m, the word line 105_m+1, the capacitor line 106_m, the capacitor line 106_m+1, the insulating film 107, the insulating film 108, and the bit line 109_n are included (see FIG. 5B).

In other words, in this embodiment, the electrode 112, the electrode 113a, and the electrode 113b are provided instead of the electrode 102, the electrode 103a, and the electrode 103b in Embodiment 1.

The electrode 112 is provided to face not only a top surface of the oxide semiconductor layer 101 but also side surfaces of the oxide semiconductor layer 101.

Furthermore, the electrode 112 may be in contact with an insulating surface on which the oxide semiconductor layer 101 is formed.

The electrode 113a and the electrode 113b are each provided to face not only the top surface of the oxide semiconductor layer 101 but also the side surfaces of the oxide semiconductor layer 101.

In that case, the electrode 113a is located between the top surface of the oxide semiconductor layer 101 and the capacitor line 106_m and between the side surfaces of the oxide semiconductor layer 101 and the capacitor line 106_m. The electrode 113b is located between the top surface of the oxide semiconductor layer 101 and the capacitor line 106_m+1 and between the side surfaces of the oxide semiconductor layer 101 and the capacitor line 106_m+1. In other words, in the vicinities of the top surface and the side surfaces of the oxide semiconductor layer 101, the electrode 113a and the capacitor line 106_m face each other with the insulating film 104 provided therebetween and the electrode 113b and the capacitor line 106_m+1 face each other with the insulating film 104 provided therebetween.

Furthermore, each of the electrodes 113a and 113b may be in contact with an insulating surface on which the oxide semiconductor layer 101 is formed.

An end of the word line 105_m overlaps with an end of the electrode 112 and an end of the electrode 113a with the insulating film 104 provided therebetween.

Similarly, an end of the word line 105_m+1 overlaps with an end of the electrode 112 and an end of the electrode 113b with the insulating film 104 provided therebetween.

In the transistor 130(m, n), not only the word line 105_m serving as a gate but also the electrode 112 and the electrode 113a serving as a source electrode and a drain electrode are provided to face a top surface and side surfaces of the oxide semiconductor layer 101. A channel formation region of the transistor 130(m, n) is formed in the vicinity of the side surfaces of the oxide semiconductor layer 101 which face the word line 105_m in addition to the vicinity of the top surface thereof, and accordingly, a channel width of the transistor 130(m, n) can be increased.

Similarly, in the transistor 130(m+1, n), not only the word line 105_m+1 serving as a gate but also the electrode 112 and the electrode 113b serving as a source electrode and a drain electrode are provided to face a top surface and side surfaces of the oxide semiconductor layer 101. A channel formation region of the transistor 130(m+1, n) is formed in the vicinity of the side surfaces of the oxide semiconductor layer 101 which face the word line 105_m+1 in addition to the vicinity of the top surface thereof, and accordingly, a channel width of the transistor 130(m+1, n) can be increased.

Furthermore, in the vicinities of the top surface and the side surfaces of the oxide semiconductor layer 101, the electrode 113a and the capacitor line 106_m face each other with the insulating film 104 provided therebetween and the electrode 113b and the capacitor line 106_m+1 face each other with the insulating film 104 provided therebetween; thus, the area of a region where the electrode 113a and the capacitor line 106_m face each other and a region where the electrode 113b and the capacitor line 106_m+1 face each other are increased, whereby capacitances held by the capacitor 150(m, n) and the capacitor 150(m+1, n) are increased.

Next, an example of a method for manufacturing the structure in this embodiment is described with reference to FIGS. 6A to 6E. The description of the same portions as those in the above embodiments is partly omitted.

Figure 6A:
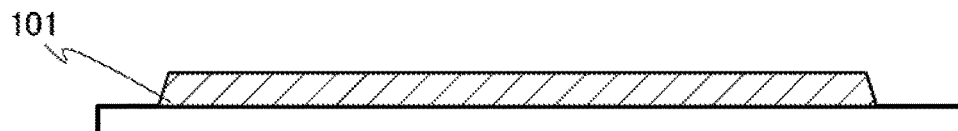
FIGS. 6A to 6E illustrate a manufacturing method of one embodiment of the present invention.

First, the oxide semiconductor layer 101 is formed (see FIG. 6A). The oxide semiconductor layer 101 may be formed on an insulating surface. As examples of the insulating surface on which the oxide semiconductor layer 101 is formed, a surface of a substrate having an insulating property and a surface of an insulating film can be given as in Embodiment 1.

The oxide semiconductor layer 101 can be formed in such a manner that an oxide semiconductor film is formed using a material similar to that in Embodiment 1 on the insulating surface and selectively removed by etching.

Figure 6B:
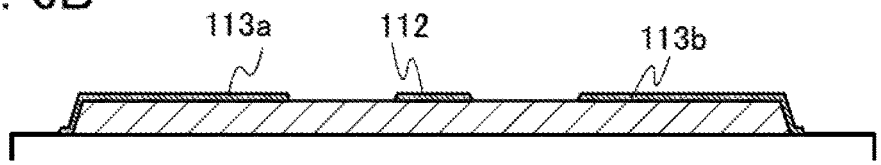

Next, the electrode 112, the electrode 113a, and the electrode 113b are formed over the oxide semiconductor layer 101 (see FIG. 6B). The electrode 112, the electrode 113a, and the electrode 113b can be formed at the same time in such a manner that a conductive film is formed over the oxide semiconductor layer 101 and selectively removed by etching.

In that case, the electrode 112, the electrode 113a, and the electrode 113b are formed to face the top surface and the side surfaces of the oxide semiconductor layer 101. In other words, each of the electrodes 112, 113a, and 113b is formed to include regions which face each other with the oxide semiconductor layer 101 provided therebetween.

Furthermore, each of the electrodes 112, 113a, and 113b may be in contact with the insulating surface on which the oxide semiconductor layer 101 is formed.

The electrode 112, the electrode 113a, and the electrode 113b can be formed using a material similar to that of the electrode 102, the electrode 103a, and the electrode 103b described in Embodiment 1.

Next, the insulating film 104 covering the oxide semiconductor layer 101, the electrode 112, the electrode 113a, and the electrode 113b is formed. The insulating film 104 may be formed using a material and a method which are similar to those in Embodiment 1.

Figure 6C:
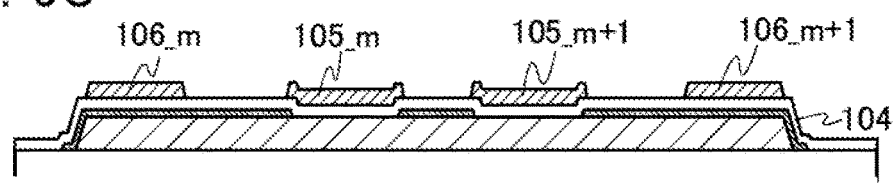

Next, the word line 105_m, the capacitor line 106_m, the word line 105_m+1, and the capacitor line 106_m+1 are formed over the insulating film 104 (see FIG. 6C). The word line 105_m, the capacitor line 106_m, the word line 105_m+1, and the capacitor line 106_m+1 can be formed at the same time in such a manner that a conductive film is formed over the insulating film 104 and is selectively removed by etching. The word line 105_m, the capacitor line 106_m, the word line 105_m+1, and the capacitor line 106_m+1 are formed in parallel to one another.

In that case, the word line 105_m is formed between the capacitor line 106_m and the word line 105_m+1, and the word line 105_m+1 is formed between the capacitor line 106_m+1 and the word line 105_m.

The word line 105_m is formed in a region between the electrode 112 and the electrode 113a to overlap with the oxide semiconductor layer 101. In that case, the word line 105_m faces not only the top surface of the oxide semiconductor layer 101 but also the side surfaces of the oxide semiconductor layer 101 with the insulating film 104 provided therebetween. Similarly, the word line 105_m+1 is formed in a region between the electrode 112 and the electrode 113b to overlap with the oxide semiconductor layer 101. In that case, the word line 105_m+1 faces not only the top surface of the oxide semiconductor layer 101 but also the side surfaces of the oxide semiconductor layer 101 with the insulating film 104 provided therebetween.

Furthermore, the word line 105_m is formed to overlap with an end of the electrode 112 and an end of the electrode 113a. Similarly, the word line 105_m+1 is formed to overlap with an end of the electrode 112 and an end of the electrode 113b.

On the other hand, the capacitor line 106_m is formed to overlap with the electrode 113a. In that case, the capacitor line 106_m also overlaps with the oxide semiconductor layer 101. In other words, the capacitor line 106_m is formed so that the electrode 113a and the insulating film 104 are located between the capacitor line 106_m and the oxide semiconductor layer 101. Furthermore, the capacitor line 106_m faces side surfaces of the electrode 113a and the side surfaces of the oxide semiconductor layer 101 with the insulating film 104 provided therebetween. Similarly, the capacitor line 106_m+1 is formed to overlap with the electrode 113b. In that case, the capacitor line 106_m+1 also overlaps with the oxide semiconductor layer 101. In other words, the capacitor line 106_m+1 is formed so that the electrode 113b and the insulating film 104 are located between the capacitor line 106_m+1 and the oxide semiconductor layer 101. Furthermore, the capacitor line 106_m+1 faces side surfaces of the electrode 113b and the side surfaces of the oxide semiconductor layer 101 with the insulating film 104 provided therebetween.

The word line 105_m, the capacitor line 106_m, the word line 105_m+1, and the capacitor line 106_m+1 can be formed using a material similar to that in Embodiment 1.

Figure 6D:
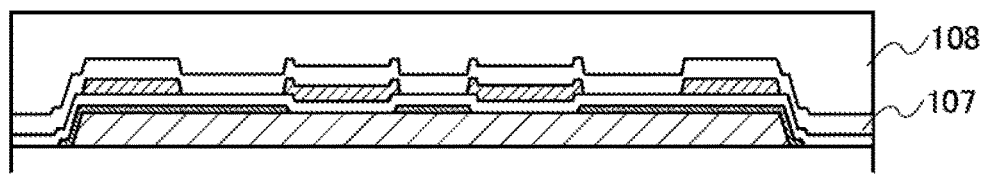

Next, the insulating film 107 and the insulating film 108 are stacked over the word line 105_m, the capacitor line 106_m, the word line 105_m+1, and the capacitor line 106_m+1 (see FIG. 6D). Note that in this embodiment, a structure in which one of the insulating film 107 and the insulating film 108 is not necessarily formed or a structure of three layers or more in which another insulating film is further formed over the insulating film 108 may be employed.

The insulating film 107 and the insulating film 108 can be formed using materials similar to those in Embodiment 1.

Figure 6E:
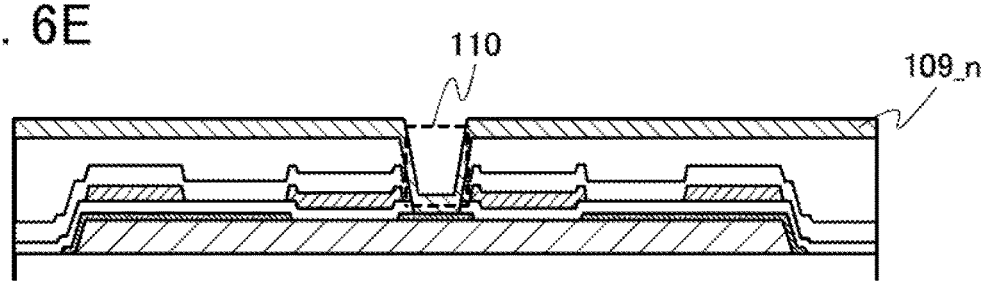

After the contact hole 110 is formed, the bit line 109_n is formed (see FIG. 6E). The bit line 109_n can be formed in such a manner that a conductive film is formed over the insulating film 108 and selectively removed by etching. The bit line 109_n is electrically connected to the electrode 112 through the contact hole 110.

The bit line 109_n is formed in the direction perpendicular to the word line 105_m, the capacitor line 106_m, the word line 105_m+1, and the capacitor line 106_m+1. Furthermore, the bit line 109_n is formed to overlap with the oxide semiconductor layer 101. Thus, when the memory cell 100(m, n) and the memory cell 100(m+1, n) are seen from the direction perpendicular to a formation surface of the oxide semiconductor layer 101, a channel formation region of the transistor 130(m, n) overlaps with a region where the word line 105_m and the bit line 109_n are overlapped with each other and a channel formation region of the transistor 130(*m*+1, n) overlaps with a region where the word line 105_*m*+1 and the bit line 109_*n* are overlapped with each other.

The bit line 109_*n* can be formed using a material similar to that in Embodiment 1.

By the above-described method, the structure illustrated in FIGS. 5A to 5D can be formed. In a memory cell array having the structure illustrated in FIGS. 5A to 5D, a pair of memory cells adjacent to each other in the bit line direction is electrically connected to a bit line through a common contact hole; thus, higher integration can be achieved. For example, when the minimum feature size is F, in the memory cell array having the above-described structure, the area occupied by a memory cell can be 8 $F^2$.

Since the memory cell array having the structure illustrated in FIGS. 5A to 5D includes a transistor using an oxide semiconductor, power consumption can be reduced.

In addition, the memory cell array having the structure illustrated in FIGS. 5A to 5D includes a relatively large oxide semiconductor layer; thus, even in minute processing, defects due to insufficient adhesion and the like can be reduced. Accordingly, the structure described in this embodiment can achieve high yield and high integration.

Note that this embodiment can be combined with any of the other embodiments as appropriate.

Embodiment 4

A central processing unit (CPU) can be formed using the semiconductor memory device described in any of Embodiments 1 to 3 for at least part of the CPU.

Figure 7A:
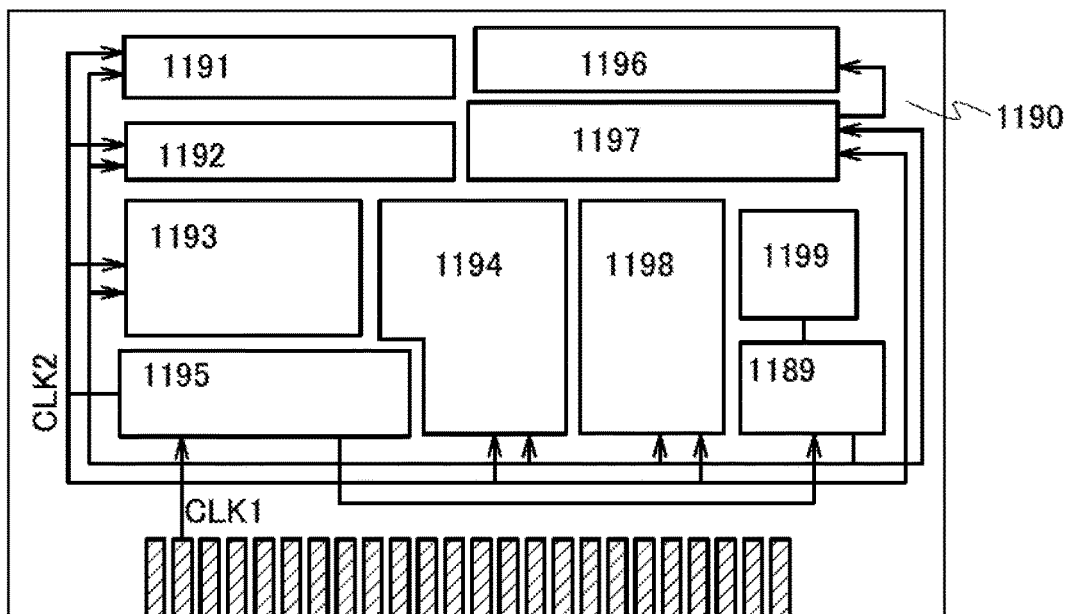
FIGS. 7A to 7C are a block diagram illustrating one embodiment of the present invention and circuit diagrams of part thereof.

FIG. 7A is a block diagram illustrating a specific configuration of a CPU. The CPU illustrated in FIG. 7A includes an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable read only memory (ROM) 1199, and a ROM interface (ROM I/F) 1189 over a substrate 1190. A semiconductor substrate, a silicon on insulator (SOI) substrate, a glass substrate, or the like is used as the substrate 1190. The ROM 1199 and the ROM interface 1189 may be provided over a separate chip. Needless to say, the CPU in FIG. 7A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 7A, a memory element is provided in the register 1196. As the memory element in the register 1196, the semiconductor memory device described in any of Embodiments 1 to 3 can be used.

In the CPU illustrated in FIG. 7A, the register controller 1197 selects operation of retaining data in the register 1196 in accordance with an instruction from the ALU 1191. That is, data is retained by an element which inverts the polarity of a signal or by a capacitor in the memory element included in the register 1196. When data is retained by the element which inverts the polarity of a signal, a power supply voltage is supplied to the memory element in the register 1196. When data is retained by the capacitor, the data in the capacitor is rewritten, and supply of the power supply voltage to the memory element in the register 1196 can be stopped.

Figure 7B:
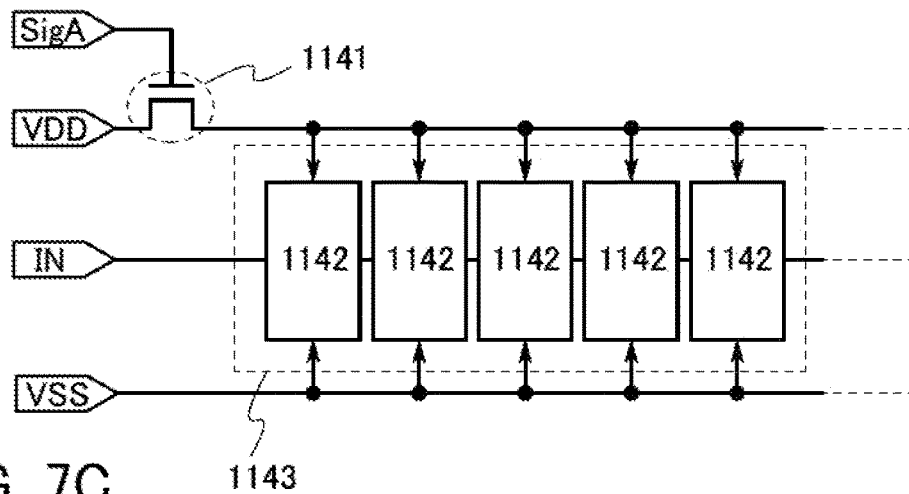
Figure 7C:
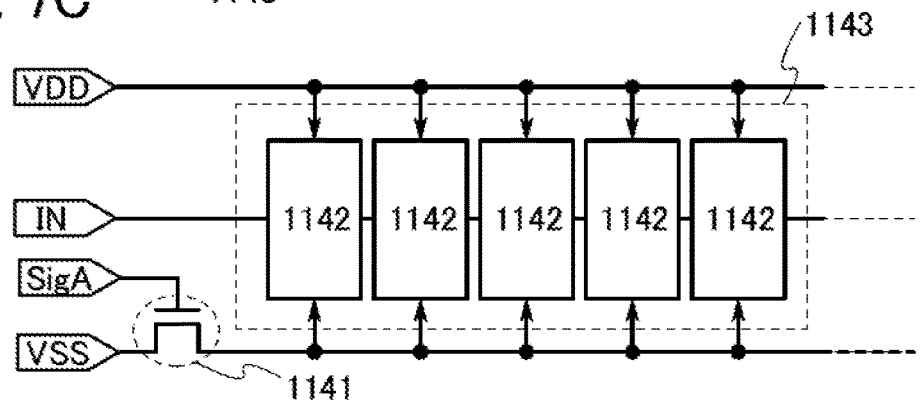

The power supply can be stopped by a switching element provided between a memory element group and a node to which a power supply potential (VDD) or a power supply potential (VSS) is supplied, as illustrated in FIG. 7B or FIG. 7C. Circuits illustrated in FIGS. 7B and 7C are described below.

The memory device illustrated in FIG. 7B includes a switching element 1141 and a memory element group 1143 including a plurality of memory elements 1142. Specifically, as each of the memory elements 1142, the semiconductor memory device described in any of Embodiments 1 to 3 can be used. Each of the memory elements 1142 included in the memory element group 1143 is supplied with the high-level power supply potential (VDD) through the switching element 1141. Furthermore, each of the memory elements 1142 included in the memory element group 1143 is supplied with a potential of a signal IN and the low-level power supply potential (VSS).

In FIG. 7B, a transistor whose active layer includes a semiconductor with a wide band gap, such as an oxide semiconductor, is used as the switching element 1141, and the switching of the transistor is controlled by a signal SigA supplied to a gate thereof.

Note that FIG. 7B illustrates a configuration in which the switching element 1141 includes only one transistor; however, one embodiment of the present invention is not limited thereto. The switching element 1141 may include a plurality of transistors. In the case where the switching element 1141 includes a plurality of transistors functioning as switching elements, the plurality of transistors may be connected to each other in parallel, in series, or in combination of parallel connection and series connection.

FIG. 7C illustrates an example of a memory device in which each of the memory elements 1142 included in the memory element group 1143 is supplied with the low-level power supply potential (VSS) through the switching element 1141. The supply of the low-level power supply potential (VSS) to each of the memory elements 1142 included in the memory element group 1143 can be controlled by the switching element 1141.

When a switching element is provided between a memory element group and a node to which the power supply potential (VDD) or the power supply potential (VSS) is supplied, data can be retained even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example here, the memory element can also be applied to an LSI, e.g., a digital signal processor (DSP), a custom LSI, or a field programmable gate array (FPGA).

This embodiment can be implemented in combination with any of the above embodiments as appropriate.

Embodiment 5

In this embodiment, examples of an electronic device including at least one of the semiconductor memory device and the CPU which are described in any of Embodiments 1 to 4 will be described.

Figure 8A:
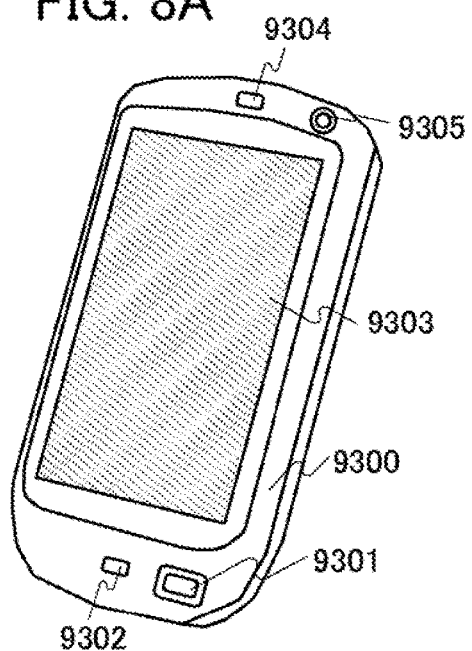
FIGS. 8A to 8D are perspective views illustrating one embodiment of the present invention.

FIG. 8A illustrates a portable information terminal. The portable information terminal illustrated in FIG. 8A includes a housing 9300, a button 9301, a microphone 9302, a display portion 9303, a speaker 9304, and a camera 9305, and has a function as a mobile phone.

Figure 8B:
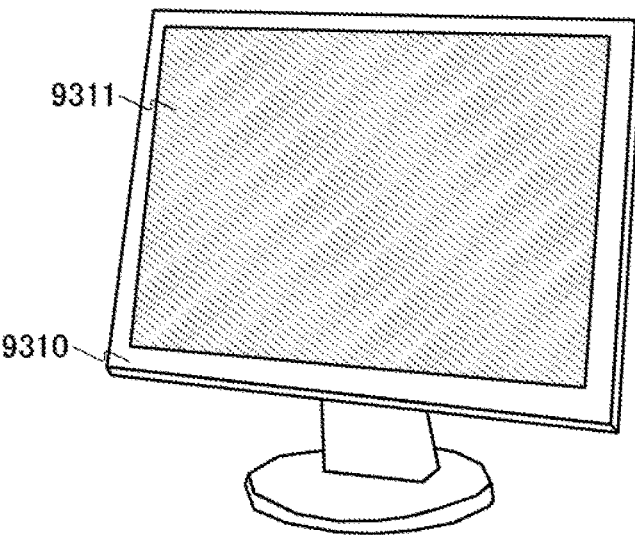

FIG. 8B illustrates a display. The display illustrated in FIG. 8B includes a housing 9310 and a display portion 9311.

Figure 8C:
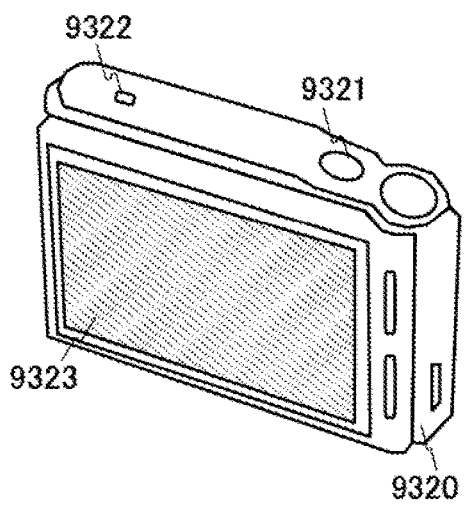

FIG. 8C illustrates a digital still camera. The digital still camera illustrated in FIG. 8C includes a housing 9320, a button 9321, a microphone 9322, and a display portion 9323.

Figure 8D:
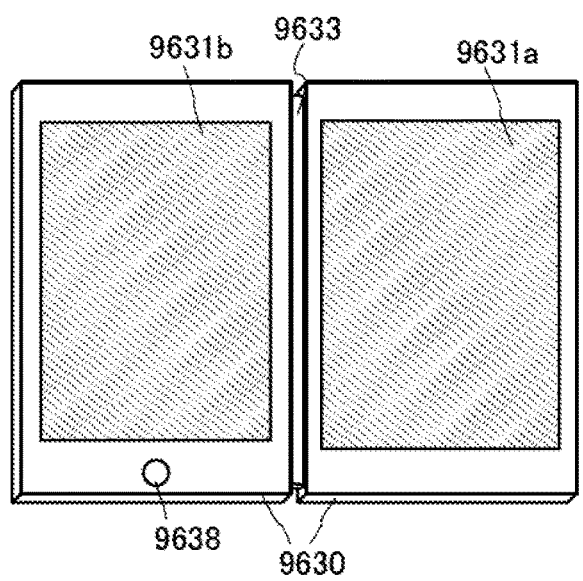

FIG. 8D illustrates a double-foldable portable information terminal. The double-foldable portable information terminal illustrated in FIG. 8D includes a housing 9630, a display portion 9631*a*, a display portion 9631*b*, a hinge 9633, and an operation switch 9638.

Part or whole of the display portion 9631*a* and/or the display portion 9631*b* can function as a touch panel, which enables data input by touching an operation key displayed thereon.

By applying one embodiment of the present invention, the performance of the electronic devices can be improved.

This embodiment can be implemented in combination with any of the above embodiments as appropriate.

This application is based on Japanese Patent Application serial no. 2013-184202 filed with Japan Patent Office on Sep. 5, 2013, the entire contents of which are hereby incorporated by reference.

What is claimed is:

1. A semiconductor device comprising:
   a semiconductor layer;
   a first electrode, a second electrode, and a third electrode over the semiconductor layer, wherein the second electrode is between the first electrode and the third electrode;
   a first insulating film over the first electrode, the second electrode, and the third electrode;
   a first wiring overlapping the first electrode with the first insulating film therebetween;
   a second wiring overlapping the semiconductor layer with the first insulating film therebetween, in a first region between the first electrode and the second electrode;
   a third wiring overlapping the semiconductor layer with the first insulating film therebetween, in a second region between the second electrode and the third electrode;
   a fourth wiring overlapping the third electrode with the first insulating film therebetween;
   a second insulating film over the first wiring, the second wiring, the third wiring, and the fourth wiring; and
   a fifth wiring over the second insulating film and electrically connected to the second electrode through a contact hole in the second insulating film,
   wherein the first wiring, the second wiring, the third wiring, and the fourth wiring are parallel to one another, and
   wherein the fifth wiring is perpendicular to the first wiring.

2. The semiconductor device according to claim 1, wherein the first electrode faces a top surface of the semiconductor layer and a side surface of the semiconductor layer.

3. The semiconductor device according to claim 1, wherein the first wiring faces a top surface of the semiconductor layer and a side surface of the semiconductor layer.

4. The semiconductor device according to claim 1,
   wherein the second wiring is electrically connected to a word line driver circuit, and
   wherein the fifth wiring is electrically connected to a bit line driver circuit.

5. The semiconductor device according to claim 1, wherein the contact hole is located between the second wiring and the third wiring.

6. The semiconductor device according to claim 1, wherein each of the first electrode, the second electrode, and the third electrode is in contact with the semiconductor layer.

7. The semiconductor device according to claim 1, further comprising an interlayer insulating film over the second insulating film, wherein the fifth wiring is located over the interlayer insulating film.

8. The semiconductor device according to claim 1, wherein the second wiring partly overlaps the first electrode and the second electrode.

9. The semiconductor device according to claim 1, wherein the semiconductor layer comprises indium and zinc.

10. The semiconductor device according to claim 1,
    wherein the first wiring overlaps the semiconductor layer, and
    wherein the fourth wiring overlaps the semiconductor layer.

* * * * *